US010715262B2

United States Patent
Nagata

(10) Patent No.: US 10,715,262 B2
(45) Date of Patent: Jul. 14, 2020

(54) TESTING DEVICE FOR ANTENNA-INCORPORATED SEMICONDUCTOR DEVICE

(71) Applicant: YOKOWO CO., LTD., Kita-ku, Tokyo (JP)

(72) Inventor: Takahiro Nagata, Tomioka (JP)

(73) Assignee: YOKOWO CO., LTD., Kita-ku, Tokyo (JP)

( * ) Notice: Subject to any disclaimer, the term of this patent is extended or adjusted under 35 U.S.C. 154(b) by 0 days.

(21) Appl. No.: 16/271,067

(22) Filed: Feb. 8, 2019

(65) Prior Publication Data

US 2019/0372687 A1    Dec. 5, 2019

(30) Foreign Application Priority Data

May 31, 2018   (JP) .................................. 2018-104510

(51) Int. Cl.
   *H04B 17/29*   (2015.01)
   *H04B 17/16*   (2015.01)
   *G01R 29/08*   (2006.01)

(52) U.S. Cl.
   CPC ......... *H04B 17/29* (2015.01); *G01R 29/0878* (2013.01); *H04B 17/16* (2015.01)

(58) Field of Classification Search
   CPC ..... H04B 17/29; H04B 17/16; G01R 29/0878
   USPC ..... 455/67.12; 324/754, 765, 761, 755, 763, 324/758, 719, 762
   See application file for complete search history.

(56) References Cited

U.S. PATENT DOCUMENTS

| | | | |
|---|---|---|---|
| 7,880,490 B2* | 2/2011 | Lee .................... | G01R 31/3025 324/750.3 |
| 2005/0174131 A1 | 8/2005 | Miller | |
| 2009/0102494 A1 | 4/2009 | Miller | |
| 2009/0153158 A1 | 6/2009 | Dunn et al. | |
| 2014/0347081 A1* | 11/2014 | Akiyama .......... | G01R 31/2891 324/750.23 |
| 2015/0050893 A1* | 2/2015 | Nickel ..................... | G01N 3/56 455/67.14 |
| 2015/0192639 A1 | 7/2015 | Olgaard | |
| 2016/0161554 A1* | 6/2016 | DeLaCruz .......... | G01R 31/303 324/754.21 |

(Continued)

FOREIGN PATENT DOCUMENTS

| | | |
|---|---|---|
| JP | 05026938 A | 2/1993 |
| JP | 2008-131166 A | 6/2008 |

(Continued)

OTHER PUBLICATIONS

Taiwanese Office Action dated Feb. 19, 2020, issued in TW Patent Application 108107856.

(Continued)

*Primary Examiner* — Edward F Urban
*Assistant Examiner* — Angelica M Perez
(74) *Attorney, Agent, or Firm* — Morgan, Lewis & Bockius LLP

(57) ABSTRACT

A testing device for testing an antenna-incorporated semiconductor device which is integrated with an antenna is provided. The testing device includes a non-contact probe configured to receive a radio wave emitted from the antenna in a state that the non-contact probe is not in contact with the antenna. The testing device may further include a movable base body configured to be lifted and lowered.

11 Claims, 4 Drawing Sheets

(56) References Cited

U.S. PATENT DOCUMENTS

2017/0363571 A1* 12/2017 Breedon .............. G01N 27/416

FOREIGN PATENT DOCUMENTS

| | | |
|---|---|---|
| JP | 2008298508 | 12/2008 |
| JP | 2010027777 A | 2/2010 |
| JP | 2017504797 A | 2/2017 |
| TW | 200538747 A | 12/2005 |
| TW | 200928382 A | 7/2009 |
| WO | 2007108252 | 9/2007 |

OTHER PUBLICATIONS

Japanese Office Action dated Mar. 24, 2020, issued in JP Patent Application 2018104510.

* cited by examiner

TESTING DEVICE FOR ANTENNA-INCORPORATED SEMICONDUCTOR DEVICE

CROSS REFERENCE TO RELATED APPLICATIONS

This application is based on Japanese Patent Application (No. 2018-104510) filed on May 31, 2018, the contents of which are incorporated herein by way of reference.

BACKGROUND

The present invention relates to a testing device for an antenna-incorporated semiconductor device testing device, which is used for testing an antenna-incorporated semiconductor device in a semiconductor test process.

In recent years, use of millimeter-wave-band radio waves in cellphones, vehicular devices, etc. has come to be considered. In the trend toward increase of the frequency of wireless communication, an antenna (e.g., patch antenna) has come to be incorporated in semiconductor devices themselves.

In general, in a test of a semiconductor device, contact pins are brought into contact with power terminals and signal input/output terminals of the semiconductor device so as to be electrically connected thereto, and a good or bad determination is made. In a test of an antenna-incorporated semiconductor device having an antenna function, the whole of a test contactor is placed in an anechoic chamber, a testing antenna is set in the anechoic chamber, and a good or bad determination is made of the antenna function by measuring radio waves emitted from the antenna-incorporated semiconductor device.

FIG. 4 shows a conventional setup for testing an antenna-incorporated semiconductor device. An anechoic chamber 60 is prepared in which inner surfaces of electromagnetic shield plates 61 are provided with radio wave absorbers 62 preventing undesired reflection. The whole of a test contactor 10 having contact pins 11 (also called a "contact probe") is stored in the anechoic chamber 60, and a testing antenna 70 is set in the anechoic chamber 60. A reception signal of the testing antenna 70 is led out of the anechoic chamber 60 by a testing antenna connection cable 71.

A test target antenna-incorporated semiconductor device 1 has electrical connection terminals 2 which are formed on its one surface that is an electrical connection terminals arrangement surface 1a and an antenna 3 which is formed on its other surface that is an antenna formation surface 1b. The electrical connection terminals 2 include power terminals and signal input/output terminals.

To test whether the electrical characteristics and the antenna function of the antenna-incorporated semiconductor device 1 are satisfactory, the test contactor 10 is mounted and fixed, in advance, on a test board 80 which is connected to a test instrument. The antenna-incorporated semiconductor device 1 is set over the test contactor 10, and a peripheral portion of the antenna-incorporated semiconductor device 1 is pushed down by a semiconductor device pressing mechanism 90. The electrical connection terminals 2 are electrically connected to the contact pins 11 of the test contactor 10, and electrical signals and power of the test instrument are applied to the antenna-incorporated semiconductor device 1. Thereby, radio waves are emitted from the antenna 3. The semiconductor device pressing mechanism 90 has a through-hole 91 in an area that is opposed to the antenna 3 of the antenna-incorporated semiconductor device 1. Thus, the radio waves emitted from the antenna 3 are received by the testing antenna 70 and converted into an electrical signal, and the reception signal is output, via the testing antenna connection cable 71, to the test instrument which is disposed outside. In this manner, good or bad determination on the electrical characteristics and the antenna function of the antenna-incorporated semiconductor device 1 can be made at the same time.

Patent document 1 discloses an example antenna-incorporated semiconductor device and states that there was demand for formation of an antenna on a semiconductor device in the trend toward increase of the frequency of wireless communication.

[Patent document 1] JP-A-2008-131166

SUMMARY

According to one advantageous aspect of the present invention, there is provided a testing device for testing an antenna-incorporated semiconductor device which is integrated with an antenna, the testing device including:

a non-contact probe configured to receive a radio wave emitted from the antenna in a state that the non-contact probe is not in contact with the antenna.

The testing device may further include a movable base body configured to be lifted and lowered. The non-contact probe may be provided on the movable base body so as to be opposed to the antenna in a state that the non-contact probe is not in contact with the antenna.

The movable base body may be provided with an insulative probe cover which covers at least a part of the non-contact probe.

The probe cover may be configured to press most part of the antenna-incorporated semiconductor device.

A portion of the non-contact probe to be opposed to the antenna-incorporated semiconductor device may be exposed instead of being covered with the probe cover.

The antenna-incorporated semiconductor device may have a plurality of antennas. A plurality of non-contact probes, configured to receive radio waves emitted from the antennas respectively in a state that the non-contact probes are not in contact with the antennas, may be provided so as to correspond to the antennas respectively.

An electrical signal obtained by receiving the radio wave emitted from the antenna by the non-contact probe may be transmitted to a test board via electrical connection path.

The testing device may further include a contact part configured to be electrically connected to an electrical connection terminal of the antenna-incorporated semiconductor device so that the electrical connection terminal is electrically connected to a test board via the contact part.

DETAILED DESCRIPTION OF EXEMPLIFIED EMBODIMENTS

Figure 4:
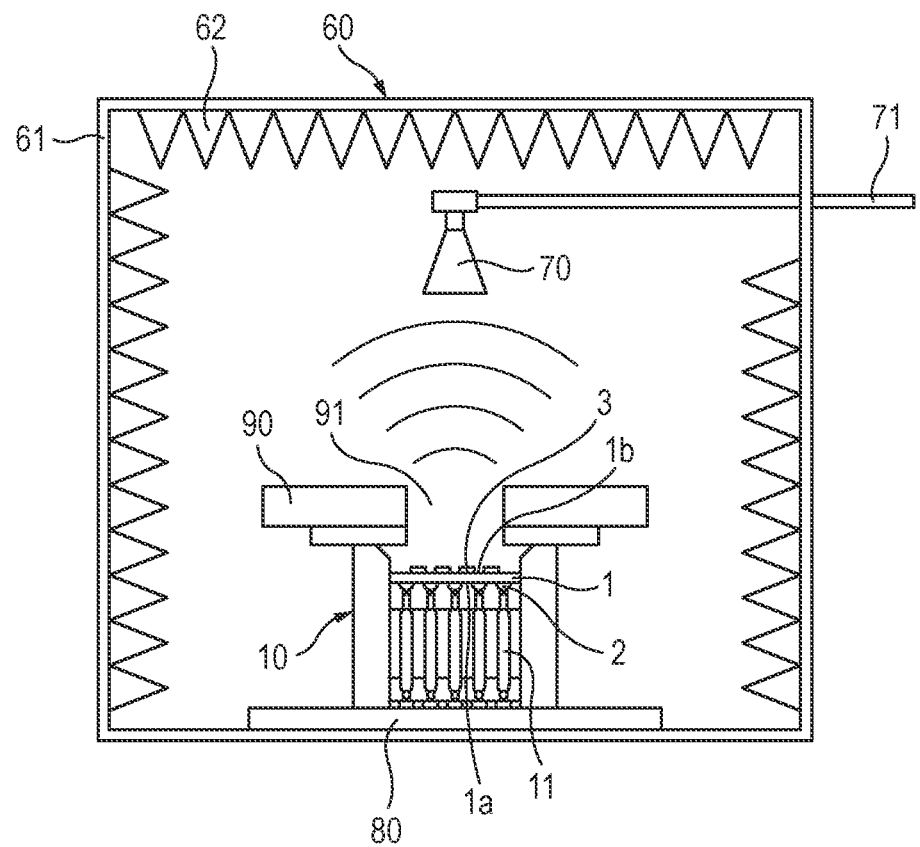
FIG. 4 is a schematic front sectional view of a conventional setup for testing an antenna-incorporated semiconductor device.

In the test of an antenna-incorporated semiconductor device using the setup shown in FIG. 4, it is necessary to prepare a large-scale anechoic chamber having a wide space that is sufficiently larger than the test contactor 10. This means a problem that the test of the antenna-incorporated semiconductor device is very costly.

The present invention has been made in view of the above circumstances, and an object of the invention is therefore to provide a testing device for an antenna-incorporated semiconductor device capable of testing an antenna function of an antenna-incorporated semiconductor device though being simple in configuration.

Preferred embodiments of the present invention will be hereinafter described in detail with reference to the drawings. The same or equivalent constituent elements, members, processes, or the like shown in the drawings will be given the same reference symbol and redundant descriptions therefor will be avoided as appropriate. The embodiments are just examples and are not intended to restrict the invention, and all features described in the embodiments and combinations thereof are not necessarily essential to the invention.

Figure 1:
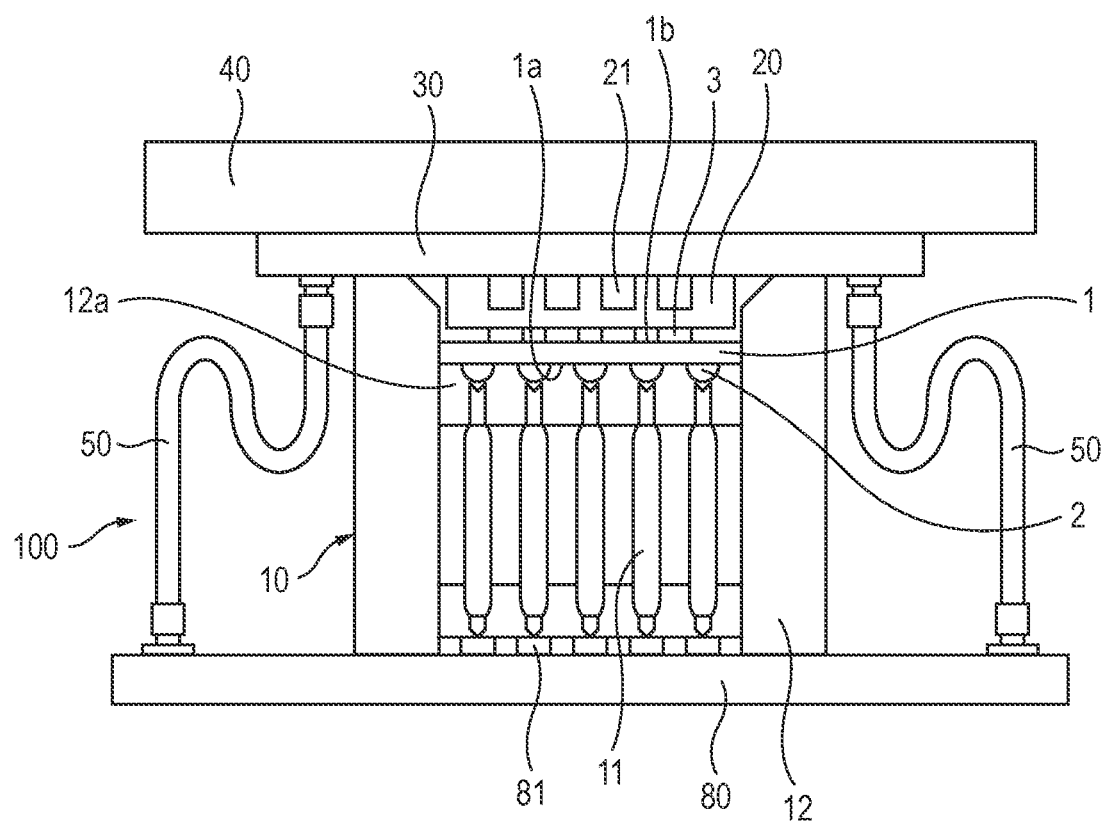
FIG. 1 is a schematic front sectional view of an antenna-incorporated semiconductor device testing device according to a first embodiment of the present invention.
Figure 2:
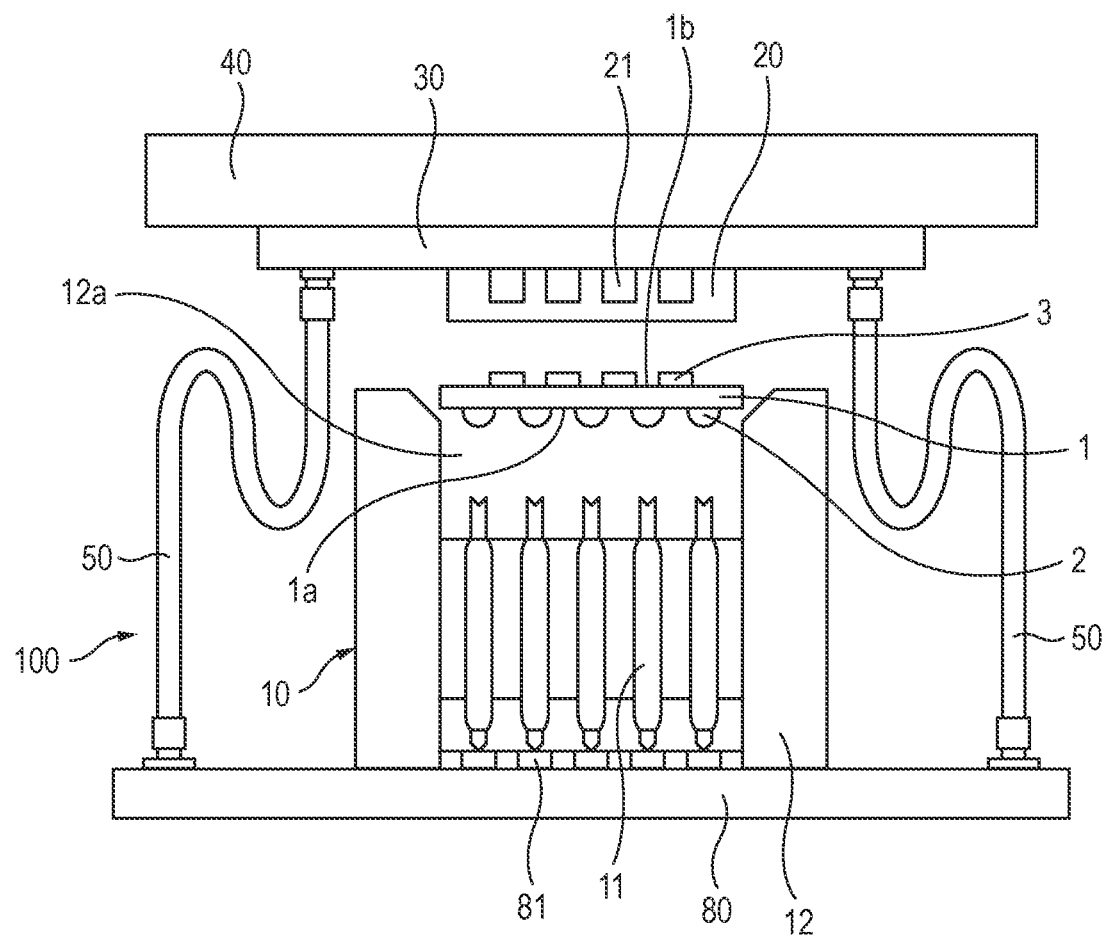
FIG. 2 is a schematic front sectional view showing a state before application of a load on an antenna-incorporated semiconductor device in the antenna-incorporated semiconductor device testing device according to the first embodiment.

A testing device 100 for an antenna-incorporated semiconductor device according to a first embodiment of the present invention will be described with reference to FIGS. 1 and 2. The testing device 100 is a device for testing an antenna-incorporated semiconductor device 1 which is integrated with an antenna 3. The testing device 100 includes a test contactor 10 which has plural contact pins 11 and a movable board 30 which is an upper board (movable base body) equipped with a non-contact probe 21 and an insulative probe cover 20.

The test contactor 10 includes a contactor housing 12 made of an insulative resin or the like and contact pins (also called a "contactor probe") 11 which are made of a conductor and penetrate through the contactor housing 12. The contactor housing 12 is mounted and fixed on a test board 80 which is a lower board connected to a test instrument (not shown). The test board 80 has contact pads 81 such as conductor films on its major surface (top surface). Base ends of the contact pins 11 are kept in contact with and electrically connected to the respective contact pads 81 by elastic forces of springs that are incorporated in the respective contact pins 11. Tip ends of the contact pins 11 can be brought into contact with electrical connection terminals 2 which are formed on an electrical connection terminals arrangement surface 1a of the test target antenna-incorporated semiconductor device 1, by elastic forces of the springs that are incorporated in the respective contact pins 11. The surface, opposite to the electrical connection terminals arrangement surface 1a, of antenna-incorporated semiconductor device 1 is an antenna formation surface 1b on which a plurality of antennas 3 are formed.

The movable board 30 is an upper board capable of being lifted and lowered. A major surface of the movable board 30 is a surface that is opposed to the antenna formation surface 1b of the antenna-incorporated semiconductor device 1. The major surface of the movable board 30 is provided with a non-contact probe 21 which is an electromagnetic probe and an insulative probe cover 20 made of an insulative resin or the like. The non-contact probe 21 is disposed so as to be opposed to the antenna 3 while not being in contact with the antenna 3, to receive radio waves emitted from the antenna 3 in a state that the non-contact probe 21 is not in contact with the antenna 3 of the antenna-incorporated semiconductor device 1. The movable board 30 is held by a pressing mechanism 40 such as an auto handler and is supported so as to be able to be lifted and lowered together with the pressing mechanism 40. Both of the non-contact probe 21 and the insulative probe cover 20 may be fixed to the movable board 30. And an alternative structure is possible in which the non-contact probe 21 is held fixedly by the insulative probe cover 20 and the insulative probe cover 20 is fixed to the movable board 30. The insulative probe cover 20 which is fixed to the movable board 30 has a function of covering at least part of the non-contact probe 21 so that the non-contact probe 21 is opposed to the antenna 3 of the antenna-incorporated semiconductor device 1 while not being in contact with the latter and a function of applying a load to the antenna-incorporated semiconductor device 1 by pushing it down toward the tips of the contact pins 11 when the pressing mechanism 40 and the movable board 30 are lowered. To apply a load uniformly to the entire antenna-incorporated semiconductor device 1, the major surface of the insulative probe cover 20 which is opposed to a recess 12a of the contactor housing 12 is a flat surface.

The non-contact probe 21 is an electromagnetic probe having a conductor pattern (e.g., band-shaped conductor pattern) corresponding to the antenna 3 of the antenna-incorporated semiconductor device 1, and receives radio waves (e.g., millimeter-wave-band radio waves) emitted from the antenna 3 of the antenna-incorporated semiconductor device 1. An electrical signal received by the non-contact probe 21 is transmitted to the test board 80 by a transmission line formed on the movable board 30 and a connection cable 50 as flexible connection path (transmission lines) which electrically connect the movable board 30 and the test board 80. In a case that plural antennas 3 are formed on the antenna formation surface 1b of the antenna-incorporated semiconductor device 1, it is preferable that non-contact probes 21 be opposed to the respective antennas 3 in one-to-one correspondence. It is also preferable that connection cables 50 such as coaxial cables be provided for the respective non-contact probes 21. However, one non-contact probe 21 may be correlated with plural antennas 3. Use of a multi-core cable as the connection cable 50 can reduce the number of connection cables.

A test on the antenna-incorporated semiconductor device 1 using the testing device 100 is performed according to the following procedure.

First, the pressing mechanism 40 is placed at an upper position (see FIG. 2), whereby the movable board 30 and the insulative probe cover 20 are set so as to be separated from the test contactor 10. Then, the antenna-incorporated semiconductor device 1 is mounted in a recess 12a of the contactor housing 12 of the test contactor 10 which is mounted and fixed on the test board 80. Tip portions of the respective contact pins 11 project from the bottom surface of recess 12a of the contactor housing 12.

Subsequently, the pressing mechanism 40 is lowered (see FIG. 1), whereby the movable board 30 and the insulative probe cover 20 are pushed down toward the test contactor 10, and the electrical connection terminals 2 of the antenna-incorporated semiconductor device 1 come into contact with the respective contact pins 11. Then, electrical signals and power of the testing instrument are applied to the antenna-incorporated semiconductor device 1. At the same time, the non-contact probe 21 which is provided in the insulative probe cover 20 is brought close to and opposed to the antenna 3.

As a result, radio waves are emitted from the antenna 3 of the antenna-incorporated semiconductor device 1, the radio waves are received by the non-contact probe 21 which is located close to and opposed to the antenna 3, and the received radio waves are converted into an electrical signal. The electrical signal obtained by the non-contact probe 21 is transmitted to the test board 80 by the transmission line (not shown) formed in the movable board 30 and a connection cable 50 and then sent to the test instrument which is connected to the test board 80. At the same time, electrical characteristics of the antenna-incorporated semiconductor device 1 are output to the test board 80 via the contact pins 11 which are electrically connected to the respective electrical connection terminals 2 and then sent to the test instrument.

The embodiment provides the following advantages:

(1) Electrical characteristics of the antenna-incorporated semiconductor device 1 can be tested using the contact pins 11 which are brought into contact with and thereby electrically connected to the respective electrical connection terminals 2, and an operation of the antenna 3 can be tested using the non-contact probe 21 which is brought close to and opposed to the antenna 3. That is, good or bad determination on the electrical characteristics and the antenna function can be made at the same time.

(2) During a test, the non-contact probe 21 is brought close to and opposed to the antenna 3. Thus, the test is hardly affected by an external electromagnetic field and hence an anechoic chamber is not necessary unlike in the conventional setup shown in FIG. 4.

(3) In the conventional setup shown in FIG. 4, to cause the testing antenna 70 to receive radio waves emitted from the antenna 3 of the antenna-incorporated semiconductor device 1, it is necessary to push portions, other than the antenna formation region of the antenna-incorporated semiconductor device 1, of the antenna formation surface 1b of the antenna-incorporated semiconductor device 1 downward toward the test contactor 10, that is, there are limitations on the regions to which a load is to be applied. This means a problem that a contact load cannot be applied stably. In contrast, in the embodiment, the major surface of the insulative probe cover 20 which covers the non-contact probe 21 is a flat surface and hence a load can be applied uniformly to most part of the antenna formation surface 1b of the antenna-incorporated semiconductor device 1. A highly reliable test can therefore be performed.

(4) Since it is not necessary to use an anechoic chamber, the antenna-incorporated semiconductor device 1 being the test target can be mounted on the test contactor 10 and taken out of the test contactor 10 easily. Thus, a number of antenna-incorporated semiconductor devices 1 can be tested efficiently.

Figure 3:
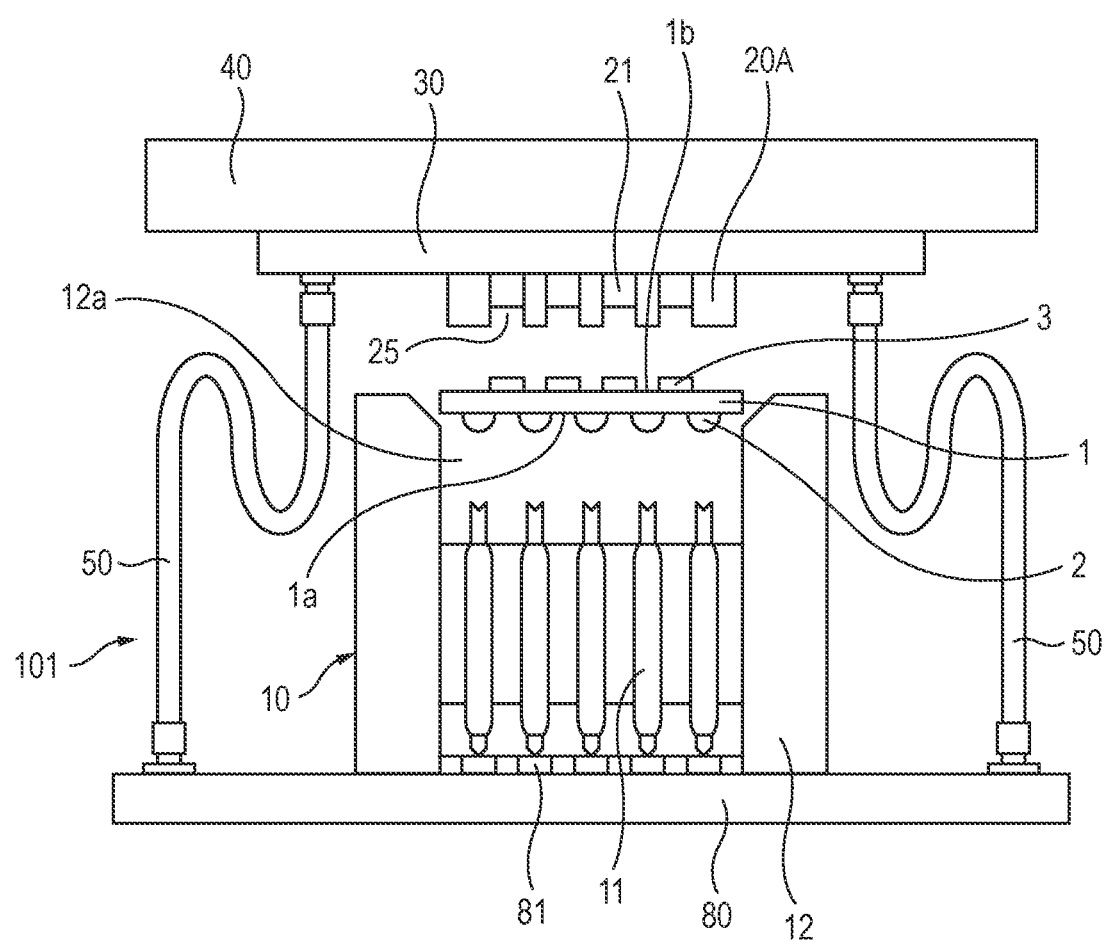
FIG. 3 is a schematic front sectional view of an antenna-incorporated semiconductor device testing device according to a second embodiment of the present invention.

Next, a testing device 101 for an antenna-incorporated semiconductor device according to a second embodiment of the invention will be described with reference to FIG. 3. The testing device 101 is different from the testing device 100 according to the first embodiment in the holding structure for the non-contact probe 21. An insulative probe cover 20A employed in the second embodiment is formed with through-holes 25, whereby portions, to be opposed to the antenna formation surface 1b of the antenna-incorporated semiconductor device 1, of the non-contact probe 21 are exposed instead of being covered with the insulative probe cover 20A. The other part of the configuration of the testing device 101 is the same as the corresponding part of the testing device 100 according to the first embodiment.

In the testing device 101, no portions of the insulative probe cover 20A exist between the surfaces opposed to each other of the antenna 3 of the antenna-incorporated semiconductor device 1 and the non-contact probe 21 during a test. Thus, absorption of radio waves by the insulative probe cover 20A which is made of a resin or the like can be prevented, which makes it possible to perform, under better conditions, a test in a millimeter wave band having a shorter radio wave wavelength range. Furthermore, since the portions, other than the through-holes 25, of the major surface of the insulative probe cover 20A are flat, a load can be applied to the entire antenna formation surface 1b of the antenna-incorporated semiconductor device 1 substantially uniformly. A state that the antenna 3 and the non-contact probe 21 are not in contact with each other can be secured by setting the depth of the through-holes 25 greater than the thickness of the antenna 3.

Although the invention has been described above by way of the embodiments, it would be understood by those skilled in the art that various modifications can be made of the individual constituent elements and processes employed the embodiments within the confines of the claims. Modifications will be described below.

In each of the embodiments, the insulative probe cover 20 or 20A and the movable board 30 (upper board) can be a unitized board that is made of a resin or the like.

In each of the embodiments, a contact part such as conductive rubber members may be used in place of the contact pins 11 of the test contactor 10.

In each of the embodiments, an electrical signal is transmitted from the non-contact probe 21 of the movable board 30 to the test board 80 via the flexible connection cable 50. Alternatively, a connection probe (a contact part) that electrically connects the movable board 30 and the test board 80 when the insulative probe cover 20 or 20A which holds the non-contact probe 21 applies a load to the antenna-incorporated semiconductor device 1 during a test may be provided in place of the connection cables 50.

Desired combinations of constituent elements described above and a method, a system, etc. obtained by converting the expression of the invention can also be effective modes of the invention.

The invention makes it possible to test an antenna function of an antenna-incorporated semiconductor device using a device that is simple in configuration.

What is claimed is:

1. A testing device for testing an antenna-incorporated semiconductor device which is integrated with an antenna, the testing device comprising:
   a non-contact probe configured to receive a radio wave emitted from the antenna in a state that the non-contact probe is not in contact with the antenna; and
   an insulative probe cover that covers the non-contact probe and configured to be movable toward the antenna-incorporated semiconductor device,
   wherein the insulative probe cover includes a flat surface to be uniformly in contact with an antenna formation surface of the antenna-incorporated semiconductor device when the insulative probe cover is moved toward the antenna-incorporated semiconductor device.

2. The testing device according to claim 1, further comprising:
   a movable base body configured to be lifted and lowered, wherein the non-contact probe is provided on the movable base body so as to be opposed to the antenna in a state that the non-contact probe is not in contact with the antenna.

3. The testing device according to claim 2, wherein the movable base body is provided with the insulative probe cover which covers at least a part of the non-contact probe.

4. The testing device according to claim 3, wherein the probe cover configured to press most part of the antenna-incorporated semiconductor device.

5. The testing device according to claim 3, wherein a portion of the non-contact probe to be opposed to the antenna-incorporated semiconductor device is exposed instead of being covered with the probe cover.

6. The testing device according to claim 1, wherein the antenna-incorporated semiconductor device has a plurality of antennas, and
a plurality of non-contact probes, configured to receive radio waves emitted from the plurality of antennas respectively in a state that the non-contact probes are not in contact with the antennas, are provided so as to correspond to the antennas respectively.

7. The testing device according to claim 1, wherein an electrical signal obtained by receiving the radio wave emitted from the antenna by the non-contact probe is transmitted to a test board via an electrical connection path.

8. The testing device according to claim 7, wherein the electrical connection path includes at least one flexible connection cable.

9. The testing device according to claim 8, wherein the flexible connection cable is a multi-core cable.

10. The testing device according to claim 1, further comprising:
a contact part configured to be electrically connected to an electrical connection terminal of the antenna-incorporated semiconductor device so that the electrical connection terminal is electrically connected to a test board via the contact part.

11. The testing device according to claim 1, wherein the insulative probe cover is configured to be movable to contact the antenna-incorporated semiconductor device.

* * * * *